(12) United States Patent
Deng et al.

(10) Patent No.: US 9,835,939 B2
(45) Date of Patent: Dec. 5, 2017

(54) GRAY-TONE MASKS AND THE MANUFACTURING METHOD THEREOF

(71) Applicant: Shenzhen China Star Optoelectronics Technology Co., Ltd., Shenzhen, Guangdong (CN)

(72) Inventors: Zhuming Deng, Guangdong (CN); Feng Zhao, Guangdong (CN); Chung-Yi Chiu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 241 days.

(21) Appl. No.: 14/763,235

(22) PCT Filed: Jun. 30, 2015

(86) PCT No.: PCT/CN2015/082818
§ 371 (c)(1),
(2) Date: Jul. 24, 2015

(87) PCT Pub. No.: WO2016/161707
PCT Pub. Date: Oct. 13, 2016

(65) Prior Publication Data
US 2017/0045815 A1    Feb. 16, 2017

(30) Foreign Application Priority Data
Apr. 10, 2015   (CN) .......................... 2015 1 0170606

(51) Int. Cl.
*G03F 1/22*    (2012.01)
*G03F 1/26*    (2012.01)
*G03F 1/38*    (2012.01)
*G03F 1/50*    (2012.01)

(52) U.S. Cl.
CPC .................. *G03F 1/22* (2013.01); *G03F 1/26* (2013.01); *G03F 1/38* (2013.01); *G03F 1/50* (2013.01)

(58) Field of Classification Search
CPC ..... G03F 1/22; G03F 1/26; G03F 1/38; G03F 1/50
USPC .......................................................... 430/5
See application file for complete search history.

(56) References Cited

FOREIGN PATENT DOCUMENTS

CN         103852969       *  6/2014   ............... G03F 1/22

* cited by examiner

*Primary Examiner* — Christopher Young
(74) *Attorney, Agent, or Firm* — Andrew C. Cheng; Tom Abeles

(57) ABSTRACT

The present disclosure relates to a gray-tone mask (GTM) and the manufacturing method thereof. The GTM includes at least one first light-blocking bar and at least on second light-blocking bar. A first gap is formed between any two adjacent first light-blocking bars. The second light-blocking bar is arranged within the first gap. The first gap includes a first crack being formed between adjacent first light-blocking bar and second light-blocking bar, wherein a length of the second light-blocking bar is "a", a width of the first crack is "b", and a ratio of the length of the second light-blocking bar ("a") to the width of the first crack ("b") satisfy the relationship: $0.9 < a/b < 1.1$. In this way, the design scope is limited. Thus, a reasonable GTM design may be obtain and the experimental cost may be reduced.

15 Claims, 2 Drawing Sheets

GRAY-TONE MASKS AND THE MANUFACTURING METHOD THEREOF

BACKGROUND OF THE INVENTION

1. Field of the Invention

The present disclosure relates to liquid crystal display technology, and more particularly to a gray-tone mask and the manufacturing method thereof.

2. Discussion of the Related Art

Conventional gray-tone masks (GTMs) only focus on that the length or dimension of the light-blocking bar within a grayscale area has to be less than the minimum resolution ratio of the yellow-light exposure system so as to obtain more fuzzy images. At the same time, the length or dimension of the light-blocking bar has to be greater than the resolution ratio of the GTM manufacturing system to ensure the manufacturing of the mask.

Nevertheless, as only the length of the light-blocking bar is limited, there is no restriction regarding the relationship between the width of the gap within the grayscale area and the length of the light-blocking bar. Thus, it is very feasible when designing the width of the gap within the grayscale area and the length of the light-blocking bar. In addition, the quality of the photo-resist contours, after being developed, for different GTM designs may be good or not, such that the GTM performance is not good. Thus, it is needed to tune the conventional GTM manufacturing, which results in a high experimental cost and the long manufacturing time.

SUMMARY

The object of the claimed invention is to provide a GTM and the manufacturing method thereof so as to limit the design scope. Thus, a reasonable GTM design may be obtain and the experimental cost may be reduced.

In one aspect, a gray-tone mask (GTM) includes: at least one first light-blocking bar and at least on second light-blocking bar, a first gap being formed between any two adjacent first light-blocking bars, the second light-blocking bar being arranged within the first gap, the first gap including a first crack being formed between adjacent first light-blocking bar and second light-blocking bar, wherein a length of the second light-blocking bar is "a", a width of the first crack is "b", and a ratio of the length of the second light-blocking bar ("a") to the width of the first crack ("b") satisfying the relationship: $0.9<a/b<1.1$; the length of the second light-blocking bar ("a") being configured to be less than a minimum resolution ratio of an exposure system and to be greater than a resolution ratio of the manufacturing system of the GTM, when the first gap being provided with at least two second light-blocking bars, a second crack being formed between two adjacent second light-blocking bars, and the width of the first crack is equal to the width of the second crack.

Wherein a length of the second light-blocking bar is equal to the width of the first crack.

3. The GTM as claimed in claim 1, wherein, within the first gap, a number of the first crack plus the number of the second crack equal to the number of the second light-blocking bar plus one.

Wherein the width of the first gap equals to a sum of the length of all of the second light-blocking bars, the width of the first crack, and the width of the second crack within the first gap.

Wherein an aperture rate of the GTM equals to the sum of the width of the first cracks and the second cracks within the first gap to the width of the first gap.

In another aspect, a gray-tone mask (GTM) includes: at least one first light-blocking bar and at least on second light-blocking bar, a first gap being formed between any two adjacent first light-blocking bars, the second light-blocking bar being arranged within the first gap, the first gap including a first crack being formed between the adjacent first light-blocking bar and second light-blocking bar, wherein a length of the second light-blocking bar is "a", a width of the first crack is "b", and a ratio of the length of the second light-blocking bar ("a") to the width of the first crack ("b") satisfying the relationship: $0.9<a/b<1.1$.

Wherein the length of the second light-blocking bar ("a") being configured to be less than a minimum resolution ratio of an exposure system and to be greater than a resolution ratio of the manufacturing system of the GTM.

Wherein a length of the second light-blocking bar is equal to the width of the first crack.

Wherein when the first gap being provided with at least two second light-blocking bars, a second crack is formed between two adjacent second light-blocking bars, and the width of the first crack is equal to the width of the second crack.

Wherein, within the first gap, a number of the first crack plus the number of the second crack equal to the number of the second light-blocking bar plus one.

Wherein the width of the first gap equals to a sum of the length of all of the second light-blocking bars, the width of the first crack, and the width of the second crack within the first gap.

Wherein an aperture rate of the GTM equals to the sum of the width of the first cracks and the second cracks within the first gap to the width of the first gap.

Wherein the length of the first light-blocking bar equals to the width of the first gap.

In another aspect, a manufacturing method of GTM includes: providing a substrate, wherein an opaque-material layer being provided on the substrate; etching the substrate by an excimer laser ablation process to form the GTM; wherein the GTM including at least one first light-blocking bar and at least on second light-blocking bar, a first gap being formed between any two adjacent first light-blocking bars, the second light-blocking bar being arranged within the first gap, the first gap including a first crack being formed between the adjacent first light-blocking bar and second light-blocking bar, wherein a length of the second light-blocking bar is "a", a width of the first crack is "b", and a ratio of the length of the second light-blocking bar ("a") to the width of the first crack ("b") satisfying the relationship: $0.9<a/b<1.1$.

Wherein when the first gap being provided with at least two second light-blocking bars, a second crack is formed between two adjacent second light-blocking bars, and the width of the first crack is equal to the width of the second crack In view of the above, the GTM includes at least one first light-blocking bar and at least one second light-blocking bars. A first gap may be formed between two adjacent first light-blocking bars. The second light-blocking bar may be arranged within the first gap. The first gap includes the first crack formed between the first light-blocking bar and the second light-blocking bar. The length of the second light-blocking bar is "a", the width of the first crack is "b", and the length of the second light-blocking bar ("a") and the width of the first crack ("b") satisfy the relationship: $0.9<a/$ b<1.1. Thus, the length of the second light-blocking bar is "a" is less than the minimum resolution ratio of the yellow-light exposure system and is greater than the resolution ratio of the manufacturing system of the GTM. The design scope of the GTM is limited, and the reasonable GTM design may be obtain. The experimental cost may be reduced, and the better photo-resist contour may be obtained

DETAILED DESCRIPTION OF THE EMBODIMENTS

Embodiments of the invention will now be described more fully hereinafter with reference to the accompanying drawings, in which embodiments of the invention are shown.

Figure 1:
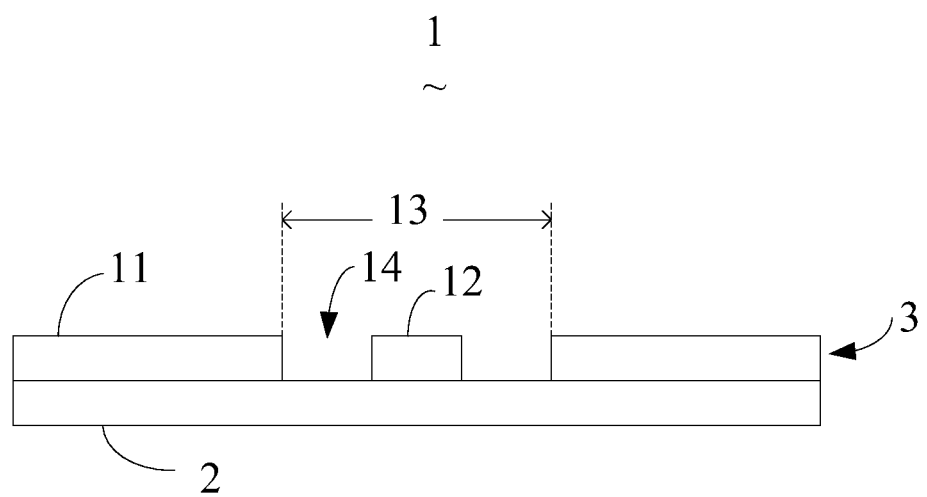
FIG. 1 is a schematic view of the GTM in accordance with a first embodiment.

FIG. 1 is a schematic view of the GTM in accordance with a first embodiment. As shown in FIG. 1, the GTM 1 is made by a substrate 2 and an opaque-material layer 3. The substrate 2 may be a transparent quartz glass. The opaque-material layer 3 is plated on a surface of the substrate 2 via sputtering. Generally, the opaque-material layer 3 is a chromium layer. The GTM 1 includes at least one first light-blocking bar 11 and at least one second light-blocking bar 12. The first light-blocking bar 11 and the second light-blocking bar 12 are formed by etching the opaque-material layer 3 by laser. The length of the first light-blocking bar 11 is greater than the length of the second light-blocking bar 12. A first gap 13 may be formed between two adjacent first light-blocking bars 11. The second light-blocking bar 12 may be arranged within the first gap 13. In the embodiment, the second light-blocking bar 12 is arranged between the two adjacent first light-blocking bars 11. The distance between the second light-blocking bar 12 and the first light-blocking bar 11 at two sides is equal. In other words, a first crack 14 is formed between any two adjacent first light-blocking bar 11 and the second light-blocking bar 12. The width of the first cracks 14 is equal. The first gap 13 includes the first cracks 14 and the second light-blocking bar 12. The length of the second light-blocking bar 12 is "a", the width of the first crack 14 is "b", and the length of the second light-blocking bar 12 ("a") and the width of the first crack 14 ("b") satisfy the relationship: $0.9 < a/b < 1.1$.

In the embodiment, the first light-blocking bar 11 forms the opaque-material layer 3 of the GTM 1. The first gap 13 formed by the first crack 14 and the second light-blocking bar 12 is the grayscale area of the GTM 1. The first gap 13 may be translucent, and the light transmission ratio may be affected by the length of the second light-blocking bar 12 and the width of the first crack 14.

In addition, the length of the second light-blocking bar 12 ("a") has to be configured to be less than the minimum resolution ratio of the exposure system. It is to be noted that the minimum resolution ratio relating to the minimum resolution ratio of the yellow light machine such that the images after being exposed and developed may be fuzzy. In order to guarantee the application of the GTM 1, the length of the second light-blocking bar 12 ("a") has to be greater than the resolution ratio of the manufacturing system of the GTM 1.

Compared to the conventional technology, The GTM 1 includes at least one first light-blocking bar 11 and at least one second light-blocking bar 12. The first gap 13 may be formed between two adjacent first light-blocking bars 11. The first gap 13 is the grayscale area of the GTM 1. The second light-blocking bar 12 may be arranged within the first gap 13. The first crack 14 is formed between any two adjacent first light-blocking bar 11. The second light-blocking bar 12 is spaced apart from the first light-blocking bars 11 at a certain distance.

In addition, the length of the second light-blocking bar 12 is "a" is less than the minimum resolution ratio of the yellow-light exposure system and is greater than the resolution ratio of the manufacturing system of the GTM 1. In addition, the length of the second light-blocking bar 12 ("a") and the width of the first crack 14 ("b") satisfy the relationship: $0.9 < a/b < 1.1$. Thus, the design scope of the GTM 1 is limited, and the reasonable GTM design may be obtain. In this way, practical photo-resist contour may be obtained so as to accomplish the gray-tone masking, which greatly reduces the experimental cost.

Figure 2:
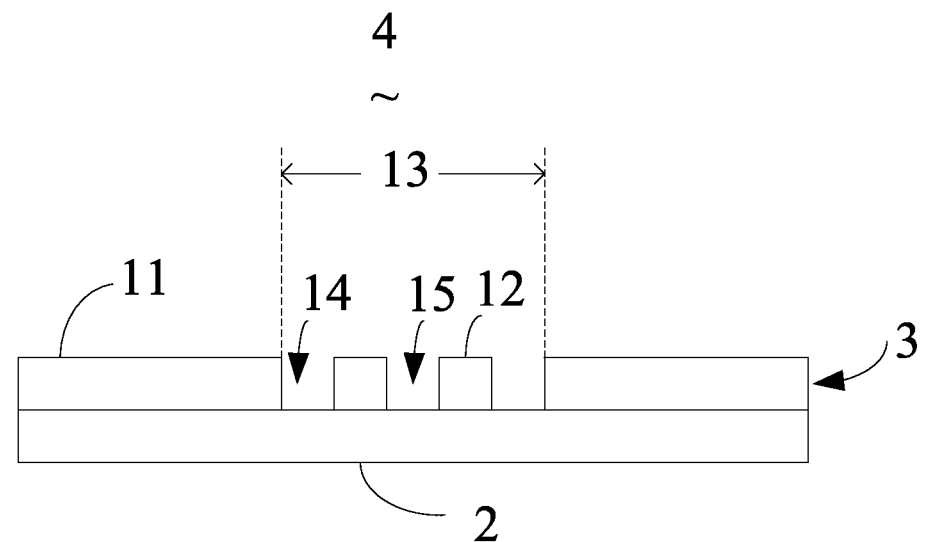
FIG. 2 is a schematic view of the GTM in accordance with a second embodiment.

FIG. 2 is a schematic view of the GTM in accordance with a second embodiment.

The difference between the GTM 4 of the second embodiment and the GTM 1 of the first embodiment resides in that at least two second light-blocking bar 12 are arranged between any two adjacent first light-blocking bars 11. In the embodiment, two second light-blocking bars 12 being provided are taken as an example. It is to be noted that the components in FIG. 2 having the same reference numerals in FIG. 1 means that the functions of the components are the same. As shown in FIG. 2, two second light-blocking bars 12 are provided between two adjacent first light-blocking bars 11. Any two of the adjacent first light-blocking bars 11 are spaced apart at a certain distance. That is, the first crack 14 is formed between the first light-blocking bar 11 and the second light-blocking bar 12. A second crack 15 is formed between the two adjacent second light-blocking bars 12. The width of the first crack 14 is equal to the width of the second crack 15. The length of the second light-blocking bar 12 is equal to the width of the first crack 14 or the second crack 15. That is, a: b=1.

Within the first gap 13 of the GTM 4, a number of the first crack 14 plus the number of the second crack 15 equal to the number of the second light-blocking bar plus one. In addition, the width of the first gap 13 equals to a sum of the length of all of the second light-blocking bars 12, the width of the first crack 14, and the width of the second crack 15 within the first gap 13. That is, within the grayscale area of the GTM 4, a number of the first crack 14 is one more than the number of the light-blocking bar. The width of the grayscale area is the sum of the length of the light-blocking bars and the width of the cracks.

The aperture rate of the GTM 4 relates to the sum of the width of the first cracks 14 and the second cracks 15 within the first gap 13 to the width of the first gap 13. For instance, the length of the first light-blocking bar is 4 μm, the length of the second light-blocking bar is 0.8 μm, the width of the first crack 14 and the second crack 15 is 0.8 μm, and the width of the first gap 13 is 4 μm. That is, the width of the first gap 13 equals to the sum of 2a+3b, wherein the width of the first crack 14 and that of the second crack 15 are shown as "b." The aperture rate of the GTM 4 is shown as: 3b/(2a+3b).

Thus, the aperture rate of the GTM 4 is 60.0%, wherein the length of the first light-blocking bar 11 equals to the width of the first gap 13.

In view of the above, the length of the light-blocking bar 12 ("a") and the width of the first crack 14 ("b") of the GTM 4 satisfy the relationship "$0.9<a/b<1.1$". In addition, in order to satisfy the requirement of conventional technology, the length of the light-blocking bar 12 ("a") is less than the minimum resolution ratio of the exposure system and is greater than the resolution ratio of the manufacturing system of the GTM 4. As such, a better photo-resist contour may be obtained so as to accomplish the gray-tone masking. With respect to the relationship between the length and the width of the first light-blocking bar 11, and the number of the second light-blocking bar 12, the first crack 14, the second crack 15 within the first gap 13. As there is no design restriction, and thus the design of the GTM 4 is more feasible. In addition, by configuring the ratio of the length of the light-blocking bars to the width of the crack to be in a range defined as: $0.9<a/b<1.1$, the preferred design may be obtained. In this way, not only the design scope of the GTM 4 is limited, a more reasonable design solution may be obtained, which reduces the experimental cost.

Figure 3:
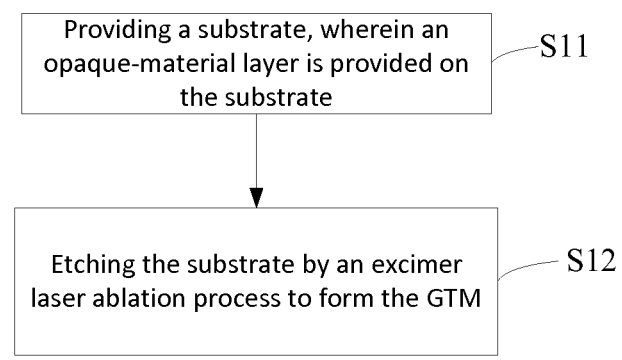
FIG. 3 is a flowchart illustrating the GTM manufacturing method in accordance with one embodiment.

Referring to FIGS. 1 and 3, FIG. 3 is a flowchart illustrating the GTM manufacturing method in accordance with one embodiment. The method includes the following blocks.

In block S11, a substrate 2 is provided, wherein an opaque-material layer 3 is provided on the substrate 2.

The substrate 2 may be a transparent quartz glass having attributes, such as high purity, low reflective rate, and low thermal expansion coefficient. The opaque material may be chromium, and is plated on the substrate via sputtering with a thickness equaling to 0.1 μm.

In block S12, the substrate 2 is etched by an excimer laser ablation process to form the GTM 1.

A mask having a transparent area and an opaque area may be adopted. The opaque area of the mask corresponds to the first light-blocking bar 11 and the second light-blocking bar 12 of the GTM 1. The transparent area corresponds to the first crack 14 of the GTM 1. The laser beams pass through the transparent area of the mask so as to form the first crack 14 on the opaque-material layer 3 on the substrate 2. The first light-blocking bar 11 and the second light-blocking bar 12 are formed on portions of the opaque-material layer 3 that have not been etched by the laser beams.

Thus, the mask having the patterns corresponding to the GTM 1 and the laser etching process are adopted to form the GTM 1 in the embodiment. The GTM 1 includes the first light-blocking bar 11 and the second light-blocking bar 12. The GTM 1 includes at least one first light-blocking bar 11 and at least one second light-blocking bar 12. A first gap 13 may be formed between two adjacent first light-blocking bars 11. The second light-blocking bar 12 may be arranged within the first gap 13. A first crack 14 is formed between any two adjacent first light-blocking bar 11 and the second light-blocking bar 12. The length of the second light-blocking bar 12 is "a", the width of the first crack 14 is "b", and the length of the second light-blocking bar 12 ("a") and the width of the first crack 14 ("b") satisfy the relationship: $0.9<a/b<1.1$.

In addition, at least two second light-blocking bars 12 are arranged within the first gap 13. In addition, a second crack 15 is formed between any two adjacent second light-blocking bars 12. The width of the first crack 14 is equal to the width of the second crack 15. That is, any two light-blocking bars are spaced apart from each other at a certain distance.

The length of the second light-blocking bar 12 ("a") has to be greater than the resolution ratio of the manufacturing system of the GTM 1, and has to be less than the minimum resolution ratio of the yellow-light exposure system.

In view of the above, the GTM includes at least one first light-blocking bar and at least one second light-blocking bars. A first gap may be formed between two adjacent first light-blocking bars. The second light-blocking bar may be arranged within the first gap. The first gap includes the first crack formed between the first light-blocking bar and the second light-blocking bar. The length of the second light-blocking bar is "a", the width of the first crack is "b", and the length of the second light-blocking bar ("a") and the width of the first crack ("b") satisfy the relationship: $0.9<a/b<1.1$. Thus, the length of the second light-blocking bar is "a" is less than the minimum resolution ratio of the yellow-light exposure system and is greater than the resolution ratio of the manufacturing system of the GTM. In addition, the width ratio of the first crack, i.e., the second light-blocking bar and the second light-blocking bar within the grayscale area of the GTM, satisfies the equation: $0.9<a/b<1.1$. Thus, the design scope of the GTM 1 is limited, and the reasonable GTM design may be obtain. The experimental cost may be reduced, and the better photo-resist contour may be obtained It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A gray-tone mask (GTM), comprising:
   at least one first light-blocking bar and at least on second light-blocking bar, a first gap being formed between any two adjacent first light-blocking bars, the second light-blocking bar being arranged within the first gap, the first gap comprising a first crack being formed between adjacent first light-blocking bar and second light-blocking bar, wherein a length of the second light-blocking bar is "a", a width of the first crack is "b", and a ratio of the length of the second light-blocking bar ("a") to the width of the first crack ("b") satisfying the relationship: $0.9<a/b<1.1$;
   the length of the second light-blocking bar ("a") being configured to be less than a minimum resolution ratio of an exposure system and to be greater than a resolution ratio of the manufacturing system of the GTM, when the first gap being provided with at least two second light-blocking bars, a second crack being formed between two adjacent second light-blocking bars, and the width of the first crack is equal to the width of the second crack.

2. The GTM as claimed in claim 1, wherein a length of the second light-blocking bar is equal to the width of the first crack.

3. The GTM as claimed in claim 1, wherein, within the first gap, a number of the first crack plus the number of the second crack equal to the number of the second light-blocking bar plus one.

4. The GTM as claimed in claim 3, wherein the width of the first gap equals to a sum of the length of all of the second light-blocking bars, the width of the first crack, and the width of the second crack within the first gap.

5. The GTM as claimed in claim 4, wherein an aperture rate of the GTM equals to the sum of the width of the first cracks and the second cracks within the first gap to the width of the first gap.

6. A gray-tone mask (GTM), comprising:
at least one first light-blocking bar and at least on second light-blocking bar, a first gap being formed between any two adjacent first light-blocking bars, the second light-blocking bar being arranged within the first gap, the first gap comprising a first crack being formed between the adjacent first light-blocking bar and second light-blocking bar, wherein a length of the second light-blocking bar is "a", a width of the first crack is "b", and a ratio of the length of the second light-blocking bar ("a") to the width of the first crack ("b") satisfying the relationship: $0.9 < a/b < 1.1$.

7. The GTM as claimed in claim 6, wherein the length of the second light-blocking bar ("a") being configured to be less than a minimum resolution ratio of an exposure system and to be greater than a resolution ratio of the manufacturing system of the GTM.

8. The GTM as claimed in claim 6, wherein a length of the second light-blocking bar is equal to the width of the first crack.

9. The GTM as claimed in claim 6, wherein when the first gap being provided with at least two second light-blocking bars, a second crack is formed between two adjacent second light-blocking bars, and the width of the first crack is equal to the width of the second crack.

10. The GTM as claimed in claim 9, wherein, within the first gap, a number of the first crack plus the number of the second crack equal to the number of the second light-blocking bar plus one.

11. The GTM as claimed in claim 10, wherein the width of the first gap equals to a sum of the length of all of the second light-blocking bars, the width of the first crack, and the width of the second crack within the first gap.

12. The GTM as claimed in claim 11, wherein an aperture rate of the GTM equals to the sum of the width of the first cracks and the second cracks within the first gap to the width of the first gap.

13. The GTM as claimed in claim 6, wherein the length of the first light-blocking bar equals to the width of the first gap.

14. A manufacturing method of GTM, comprising:
providing a substrate, wherein an opaque-material layer being provided on the substrate;
etching the substrate by an excimer laser ablation process to form the GTM;
wherein the GTM comprising at least one first light-blocking bar and at least on second light-blocking bar, a first gap being formed between any two adjacent first light-blocking bars, the second light-blocking bar being arranged within the first gap, the first gap comprising a first crack being formed between the adjacent first light-blocking bar and second light-blocking bar, wherein a length of the second light-blocking bar is "a", a width of the first crack is "b", and a ratio of the length of the second light-blocking bar ("a") to the width of the first crack ("b") satisfying the relationship: $0.9 < a/b < 1.1$.

15. The manufacturing method as claimed in claim 14, wherein when the first gap being provided with at least two second light-blocking bars, a second crack is formed between two adjacent second light-blocking bars, and the width of the first crack is equal to the width of the second crack.

* * * * *